United States Patent [19]

Murao et al.

[11] Patent Number: 5,349,219
[45] Date of Patent: Sep. 20, 1994

[54] WAFER-SCALE SEMICONDUCTOR INTEGRATED CIRCUIT DEVICE AND METHOD OF FORMING INTERCONNECTION LINES ARRANGED BETWEEN CHIPS OF WAFER-SCALE SEMICONDUCTOR INTEGRATED CIRCUIT DEVICE

[75] Inventors: Toshiaki Murao, Kawasaki; Takeo Kikuchi, Choufu; Toshihiko Iryu, Kawasaki; Hidenori Nomura, Kasugai; Hiroyuki Sugamoto, Nishikasugai, all of Japan

[73] Assignees: Fujitsu Limited, Kawasaki; Fujitsu VLSI Limited, Kasugai, both of Japan

[21] Appl. No.: 175,674

[22] Filed: Dec. 30, 1993

Related U.S. Application Data

[63] Continuation of Ser. No. 821,876, Jan. 16, 1992, abandoned, which is a continuation of Ser. No. 536,130, Jun. 11, 1990, abandoned.

[30] Foreign Application Priority Data

Jun. 15, 1989 [JP] Japan .................. 1-155145
Jun. 29, 1989 [JP] Japan .................. 1-167861

[51] Int. Cl.⁵ .............. H01L 27/02; H01L 27/10; H01L 27/15
[52] U.S. Cl. .......................... 257/208; 257/210
[58] Field of Search .............. 357/23.13, 40, 45

[56] References Cited

U.S. PATENT DOCUMENTS

| | | | |
|---|---|---|---|
| 4,234,888 | 11/1980 | Calhoun et al. | 357/45 |
| 4,467,400 | 8/1984 | Stopper | 357/45 |
| 4,517,659 | 5/1985 | Chamberlain | 357/45 |
| 4,717,988 | 1/1988 | Landis | 362/403 |
| 4,731,761 | 3/1988 | Kobayashi | 365/189.06 |
| 4,802,054 | 1/1989 | Yu et al. | 357/23.13 |
| 4,914,632 | 4/1990 | Fujishima et al. | 365/200 |
| 5,008,728 | 4/1991 | Yamamura et al. | 357/45 |

FOREIGN PATENT DOCUMENTS

| | | |
|---|---|---|
| 0175870 | 12/1981 | European Pat. Off. |
| 0178227 | 10/1985 | European Pat. Off. |
| 61-224434 | 10/1986 | Japan |
| 62-97347 | 5/1987 | Japan |
| 2089117A | 6/1982 | United Kingdom |

*Primary Examiner*—J. Carroll
*Attorney, Agent, or Firm*—Armstrong, Westerman, Hattori, McLeland & Naughton

[57] ABSTRACT

A wafer-scale semiconductor integrated circuit device includes a wafer, a plurality of chips formed on the wafer, each of the chips having an internal logic circuit, interconnection lines mutually connecting the chips, and clamping circuits which are coupled to chips from among the chips which are located at a periphery of an arrangement of the chips and which prevent the interconnection lines related to the chips located at the periphery from being in a floating state.

16 Claims, 14 Drawing Sheets

WAFER-SCALE SEMICONDUCTOR INTEGRATED CIRCUIT DEVICE AND METHOD OF FORMING INTERCONNECTION LINES ARRANGED BETWEEN CHIPS OF WAFER-SCALE SEMICONDUCTOR INTEGRATED CIRCUIT DEVICE

This application is a continuation of application Ser. No. 07/821,876, filed Jan. 16, 1992, now abandoned, which is a continuation of application Ser. No. 07/536,130, filed Jun. 11, 1990, now abandoned.

BACKGROUND OF THE INVENTION

The present invention relates to a wafer-scale semiconductor integrated circuit device having a plurality of chips arranged on a wafer. Further, the present invention relates to a method for forming interconnection lines between chips on a wafer of a wafer-scale semiconductor integrated circuit device.

There is known a wafer-scale semiconductor integrated circuit device,-which has a plurality of chips formed on a single wafer of a semiconductor, such as a silicon wafer. Generally, all the chips on the wafer have the same function. Such a wafer-scale semiconductor device is suitable for application to a semiconductor integrated circuit memory. A wafer-scale semiconductor memory device has an extremely high storage capacity and high integration density.

As shown in FIG. 1, a wafer-scale semiconductor integrated circuit device has a plurality of chips 3 formed on a wafer 2. Internal connection lines of each of the chips 3 are formed using a reticle 1 as shown in FIG. 2. The reticle 1 in FIG. 2 has an internal connection line pattern part (area) 4, an exposure part (area) 5 and a light interrupt part (area) 6. The internal connection part 4 has internal connection line patterns formed of a chromium (Cr) film which functions to interrupt light. The exposure part 5 passes light and is formed by partially eliminating the chromium film. The exposure part 5 is formed so that it surrounds the internal connection part 4. The light interrupt part 6 formed of a light interrupt film, such as a chromium film, is formed so that it surrounds the exposure part 5. An exposure area on the wafer 2 is moved step by step by a stepper (a step and repeat process) so that a large number of chip patterns are depicted on a photoresist on the wafer. In this manner, a plurality of identical internal connection lines are formed on the wafer 2.

In a case where a plurality of single chip semiconductor devices are formed, the internal connection lines formed in the chips 3 are separated from each other by scribe lines 7, which are formed by double exposure of the exposure part 5 of the reticle 1 so that the chips 3 are separated from each other. On the other hand, when a wafer-scale semiconductor device is formed, interconnection lines which connect the chips 3 to each other are formed on the areas of the scribe lines 7.

Conventionally, such interconnection lines between the chips 3 are formed by the following processes. According to a first conventional process, an electron beam is projected onto the scribe lines 7 on the wafer 2 placed in an aluminum gaseous phase so that aluminum interconnection lines having predetermined patterns are grown on the scribe line areas 7. According to a second conventional process, a mask for forming interconnection lines between the chips 3 is formed by an electron beam exposure process. Then the wafer 2 is photo- etched using the mask so that interconnection lines between the chips 3 are formed. According to a third conventional process, the chips 3 are mutually connected by bonding wires.

However, the above-mentioned conventional processes have the following disadvantages. The first conventional process has a low throughput because interconnection lines between the chips 3 on the wafer 2 are defined directly by the electron beam. The second conventional process has a limited integration density because interconnection lines are formed by the photo-etching process using the mask, and in addition, reliability is not high because of the same reason. The third conventional process cannot provide a high integration density because interconnection lines are formed of bonding wires.

Chips located in the vicinity of a peripheral end of the wafer 2 have input terminals which are not connected to other chips and are in a floating (high impedance) state. For this reason, the input level of an input circuit in each of the chips located in the vicinity of the peripheral end of the wafer 2 is indefinite. The indefinite input level causes a through current passing through a CMOS circuit which forms the input circuit. This causes an increase in power consumption and a malfunction resulting from an external noise is caused.

SUMMARY OF THE INVENTION

It is a general object of the present invention to provide an improved method of forming interconnection lines between chips on a wafer in which the above-mentioned disadvantages are eliminated.

A more specific object of the present invention is to provide a method of forming interconnection lines between chips on a wafer capable of providing a higher integration density and higher throughput.

The above-mentioned objects of the present invention are achieved by a method of forming interconnection lines arranged between chips of a wafer-scale semiconductor integrated circuit device, the method comprising the steps of:

positioning a reticle at a first position with respect to a wafer, the reticle being used in common for each of the chips and including an internal connection line pattern, interconnection line patterns extending from the internal connection line pattern and connecting adjacent chips of the chips to each other and a light interrupting area surrounding the internal connection line pattern and the interconnection line patterns;

projecting a light onto the wafer through the reticle positioned at the first position;

positioning the reticle at a second position adjacent to the first position, the reticle being positioned at the second position where some of the interconnection line patterns of the reticle overlap some of the interconnection line patterns of the reticle which is positioned at the first position; and projecting the light onto the wafer through the reticle positioned at the second position.

The above-mentioned objects of the present invention are also achieved by a method of forming interconnection lines arranged between chips of a wafer-scale semiconductor integrated circuit device, the method comprising the steps of:

positioning a first reticle at a first position with respect to a wafer, the first position being located at a periphery of an arrangement of the chips, the first reticle including an internal connection line pattern, interconnection line patterns extending from the internal connection line pattern only toward adjacent chips of the chips and connecting the above-mentioned adjacent chips of the chips to each other and a light interrupting area surrounding the internal connection line pattern and the interconnection line patterns;

projecting a light onto the wafer through the first reticle positioned at the first position;

positioning a second reticle at a second position inside the first position, the second reticle including an internal connection line pattern, interconnection line patterns extending from the internal connection line pattern in four mutually perpendicular directions and connecting adjacent chips of the chips located in the four mutually perpendicular directions to each other and a light interrupting area surrounding the internal connection line patterns and the interconnection line patterns; and projecting the light onto the wafer through the second reticle positioned at the second position.

Another object of the present invention is to provide a low power consumption wafer-scale integrated circuit device which is not prevented from malfunctioning due to the presence of noise.

This object of the present invention is achieved by a wafer-scale semiconductor integrated circuit device comprising a wafer, a plurality of chips formed on the wafer, each of the chips having an internal logic circuit, interconnection lines mutually connecting the chips, and means, provided for at least chips from among the chips which are located at a periphery of an arrangement of the chips, for preventing the interconnection lines related to the peripherally located chips of the chips from being in a floating state.

BRIEF DESCRIPTION OF THE DRAWINGS

Other objects, features and advantages of the present invention will become apparent from the following detailed description when read in conjunction with the accompanying drawings, in which:

FIGS. 14A through 14D are circuit diagrams of a

DESCRIPTION OF THE PREFERRED EMBODIMENTS

Figure 1:
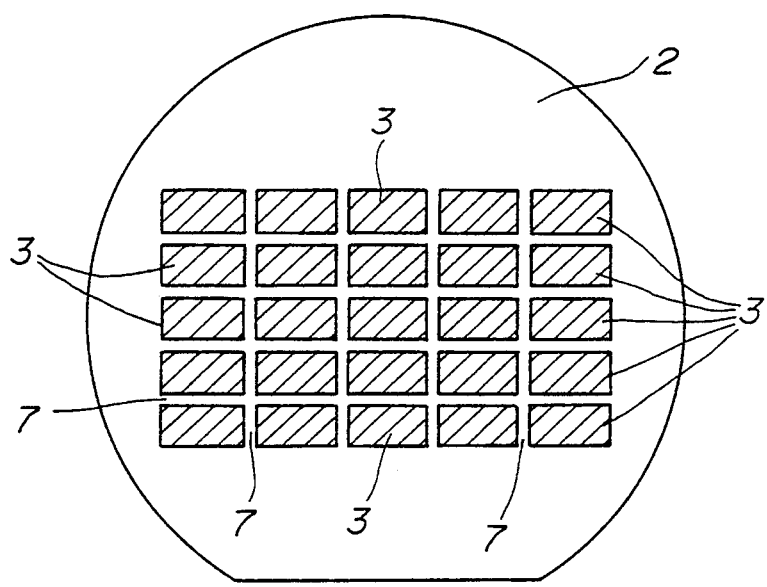
FIG. 1 is a plan view of a conventional reticle.
Figure 2:
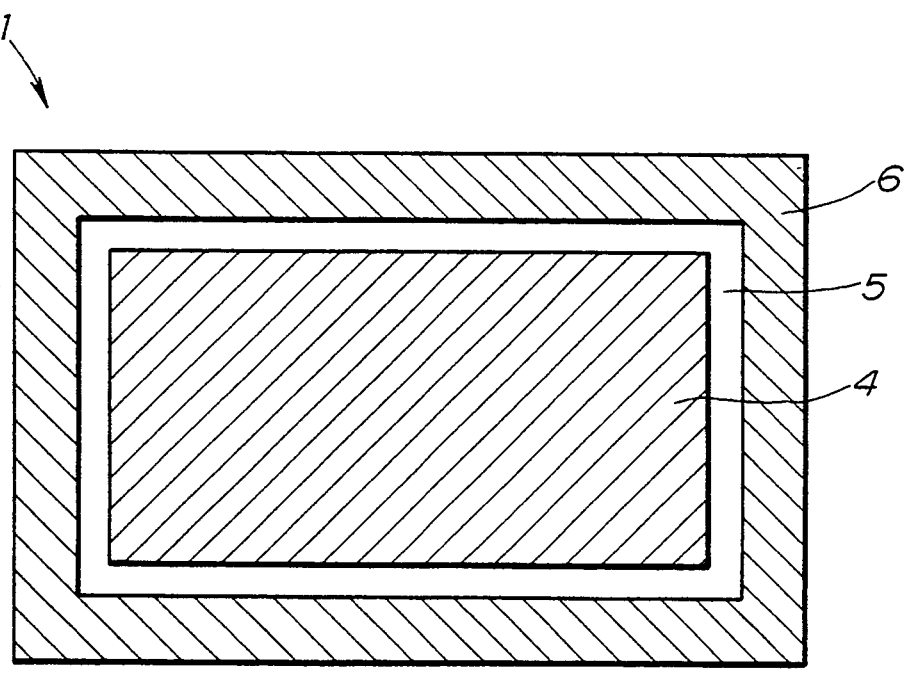
FIG. 2 is a plan view of a wafer on which a plurality of chips are formed by a conventional process.
Figure 3:
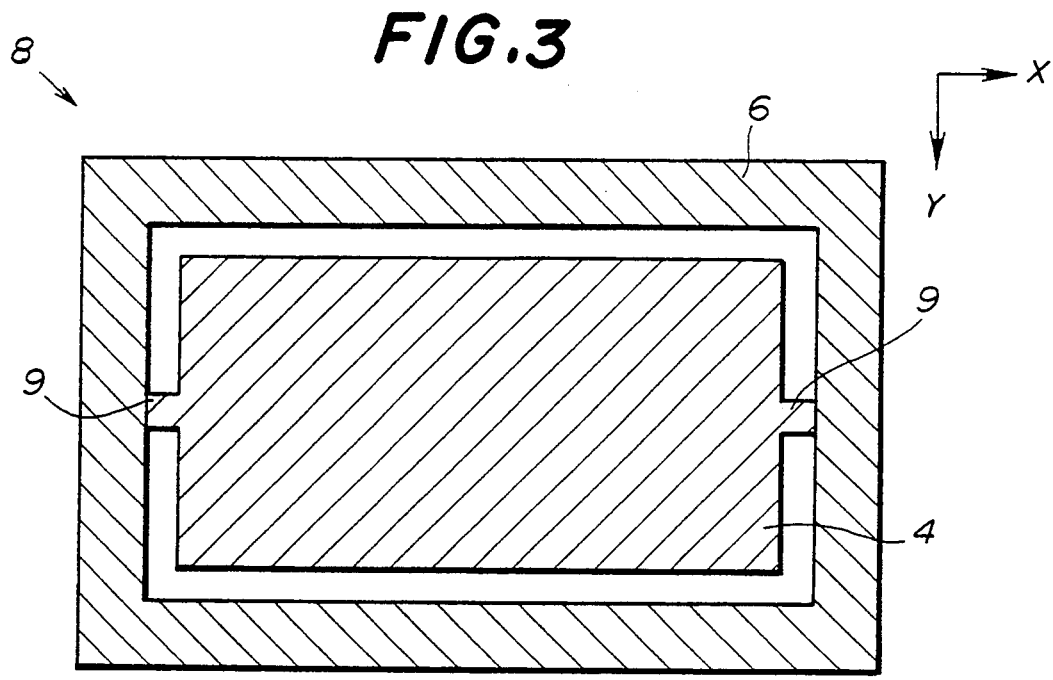
FIG. 3 is a plan view of a reticle according to a first preferable embodiment of the present invention.

Referring to FIG. 3, there is illustrated a reticle according to a first preferred embodiment of the present invention. In FIG. 3, those parts which are the same as those shown in FIG. 1 are given the same reference numerals. A reticle 8 shown in FIG. 3 has interconnection line patterns 9 which define interconnection lines provided for establishing adjacent chips on the wafer. The interconnection line patterns 9 shown in FIG. 3 extend in the X direction and are interposed between the internal connection line pattern part 4 and the light interrupting part 6. The interconnection line patterns 9 are formed of chromium, which has the function of interrupting light.

Figure 4:
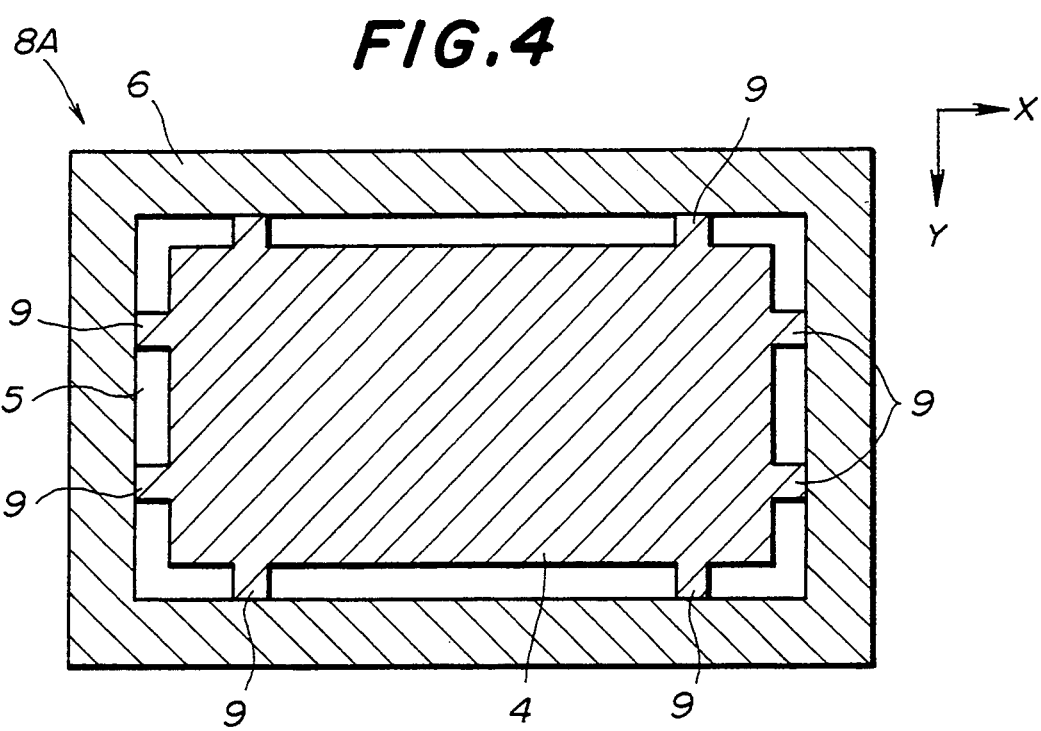
FIG. 4 is a plan view of another reticle according to the first embodiment of the present invention.

FIG. 4 shows another reticle 8A having interconnection line patterns 9 extending in the X and Y directions. Two interconnection line patterns 9 extend from each end of the internal connection line pattern part 4.

Figure 5:
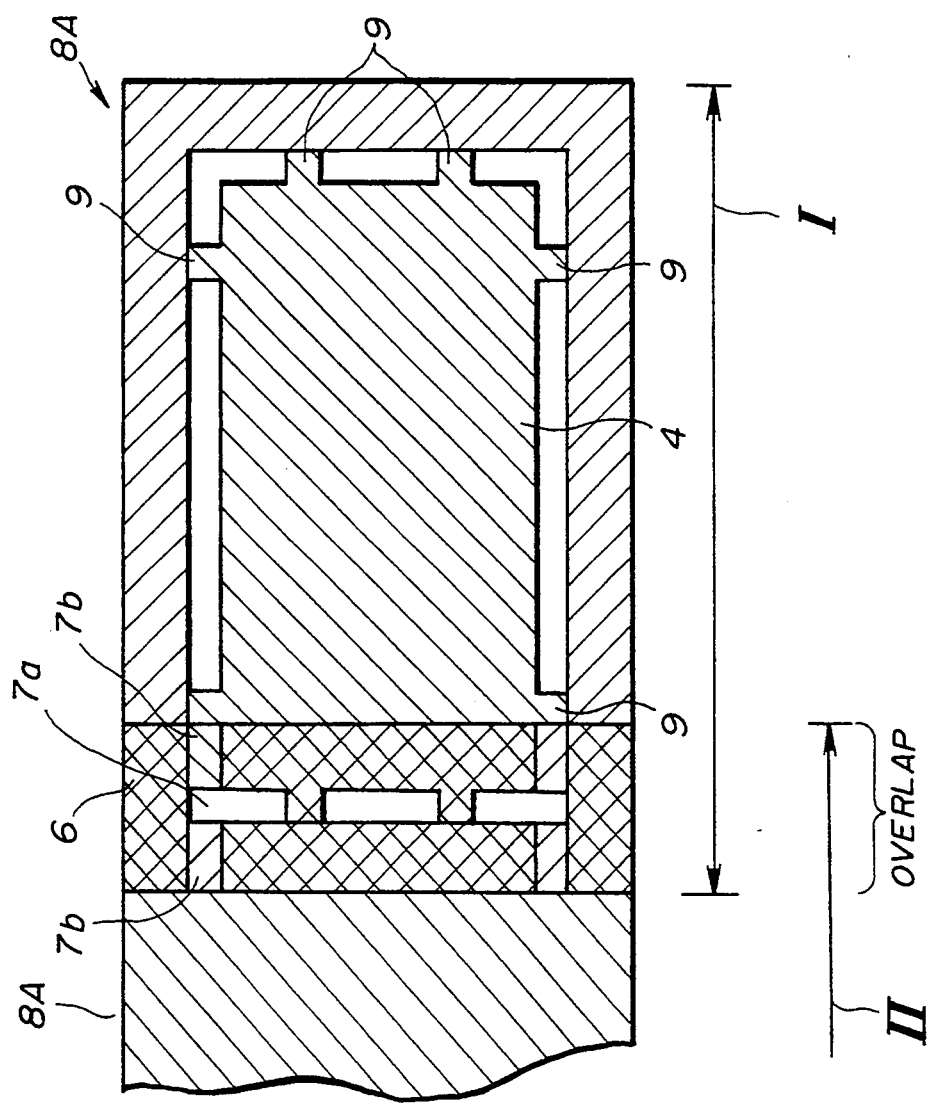
FIG. 5 is a diagram illustrating how to use the reticle shown in FIG. 4 during an exposure process.
Figure 6:
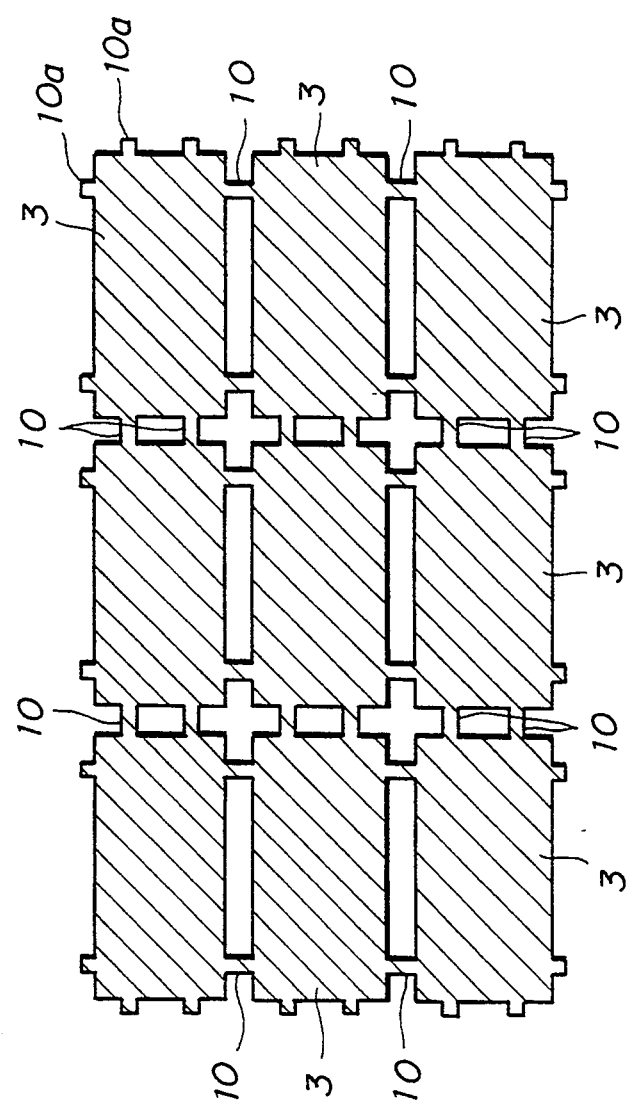
FIG. 6 is a diagram illustrating interconnection lines formed using the reticle shown in FIG. 4.

Interconnection lines between chips are established by using the reticle 8A shown in FIG. 4 as follows. The reticle 8A is fastened to a stepper (not shown). Referring to FIG. 5, the reticle 8A is positioned, as indicated by reference I. Then a photoresist film on the wafer is partially exposed. Thereby, interconnection lines 9 extending in the X and Y directions are defined at the same time as internal connection lines are formed in an area on the wafer corresponding to the internal connection line pattern part 4. Then, the wafer is shifted so that it is exposed, as shown in FIG. 5. That is, the reticle 8A is shifted so that the two interconnection line patterns 9 on the left side obtained when the reticle 8A is positioned at the position I overlap the two interconnection line patterns 9 on the right side obtained when the reticle 8A is positioned at the position II. Then the wafer is exposed by the reticle which is positioned at the position II. Thus, areas 7a on the wafer are exposed twice and areas 7b are exposed once. In this manner, as shown in FIG. 6, it is possible to simultaneously form internal connection lines in each chip 3 and interconnection lines 10 mutually connecting the adjacent chips.

Alternatively, it is possible to position the reticle 8A so that the two interconnection line patterns 9 on the left side obtained when the reticle 8A is positioned at the position I continuously join to or partially overlap with the two interconnection line patterns 9 on the right side obtained when the reticle 8A is positioned at the position II.

A description will now be given of a second preferred embodiment of the present invention. It will be noted that interconnection lines 10a shown in FIG. 6 are not used for connecting neighboring chips 3 to each other. That is, the chips 3 positioned at the periphery of the arrangement of the chips 3 have interconnection lines 10a which are not used for establishing interconnection between the chips 3 when the reticle 8A shown in FIG. 4 is used. Such interconnection lines 10a are electrically in a floating state. The presence of such a floating state causes a malfunction of the wafer-scale semiconductor integrated circuit device and an increase in power consumption thereof. The second preferred embodiment is directed to eliminating the above-mentioned problems.

Figure 7:
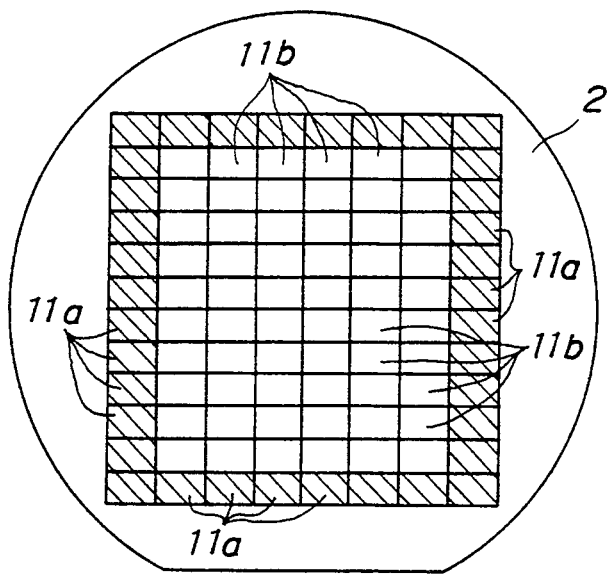
FIG. 7 is a plan view of a wafer-scale semiconductor device according to a second preferred embodiment of the present invention.

Referring to FIG. 7, a plurality of chips 11a and 11b are formed on the wafer 2. The chips 11a (illustrated by the hatched blocks) are located at the periphery of the arrangement of the chips, and the chips 11b are located so that they are surrounded by the chips 11a. Internal connection lines in each of the chips 11b and interconnection lines extending therefrom are defined by a reticle identical with that shown in FIG. 4. Internal connection lines in the chips 11a and interconnection lines extending therefrom are defined by reticles which are different from the reticle related to the chips 11b. That is, the reticles related to the chips 11a located at the periphery of the chip arrangement have interconnection line patterns which only extend toward adjacent chips. In other words, the reticles related to the chips 11a do not have input circuits having interconnection line patterns which extend toward the ends of the wafer 2 and which are not used for realizing connection between adjacent chips. Thus, there is no floating input coupled to the internal circuits of the chips 11a. It will be noted that the internal connection line patterns of the reticles related to the chips 11a are the same as those of the reticles related to the chips 11b.

Figure 8:
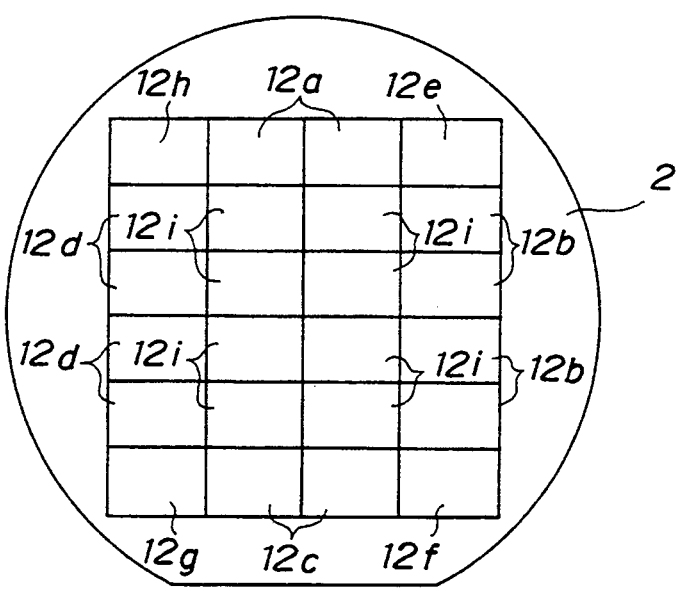
FIG. 8 and FIGS. 9(a)–9(i) are diagrams illustrating the relationship between the chips shown in FIG. 7 and related reticles.

The second embodiment of the present invention will further be described with reference to FIG. 8 and FIGS. 9(a) through 9(i). In FIG. 8, reference numerals 12a through 12i are given to chips formed on the wafer 2. Each chip having the same reference numeral has an identical internal connection line pattern formed therein and an identical interconnection line pattern extending therefrom. That is, each chip having the same reference numeral is formed by an identical reticle. For example, each of the eight chips 12i is formed by the same reticle. It will be noted that the different reticles have different interconnection line patterns and on the other hand, have the same internal connection line pattern.

Figure 9C:
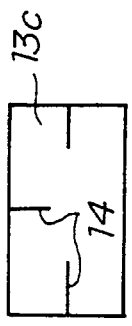
Figure 9F:
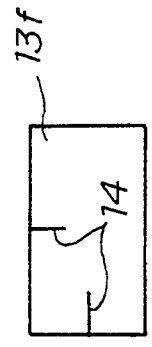
Figure 9I:
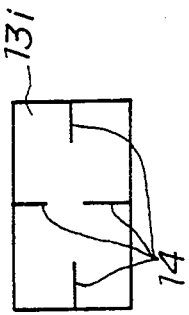
Figure 9B:
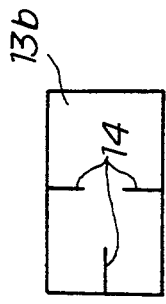
Figure 9E:
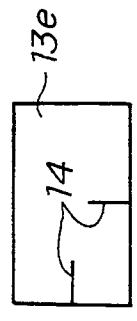
Figure 9H:
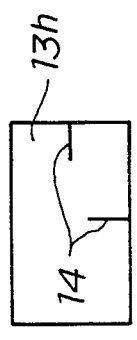
Figure 9A:
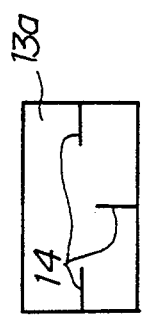
Figure 9D:
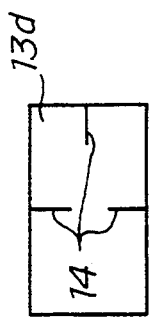
Figure 9G:
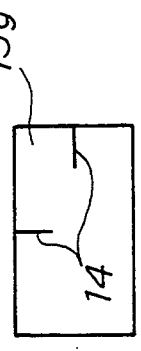

FIGS. 9(a) through 9(i) show reticles 13a through 13i used for forming internal connection lines of the chips 12a through 12(i) and interconnection lines extending therefrom, respectively. The reticle 13a shown in FIG. 9(a) is used for forming internal connection lines in each of the chips 12a and interconnection lines extending therefrom. The reticle 13a related to each of the chips 12a does not have any interconnection line which extends upward in FIG. 9(a) because there is no adjacent chip on the upper side of each chip 12a. Thus, the reticle 13a shown in FIG. 9(a) has interconnection line patterns 14 extending in three directions but not the upper direction. The reticle 13b shown in FIG. 9.(b) is used for forming internal connection lines in each of the chips 12b and interconnection lines extending therefrom. The reticle 13b related to each of the chips 12b does not have any interconnection line which extends from the right side thereof because there is no adjacent chip positioned on this side. Thus, the reticle 13b has interconnection line patterns 14 which extend in the three directions but not the right direction. The reticle 13i shown in FIG. 9(i) is used for forming internal connection lines in each of the chips 12i and interconnection lines extending therefrom. Each of the chips 12i has four adjacent chips. Thus, the reticle 13i has interconnection line patterns 14 which extend in four directions.

The chips 12a through 12h formed using the reticles 13a through 13h have no unnecessary interconnection lines which are not used for establishing interconnection with adjacent chips. Thus, it is possible to prevent the occurrence of a malfunction as well as an increase in power consumption due to the presence of floating input terminals.

Figure 10:
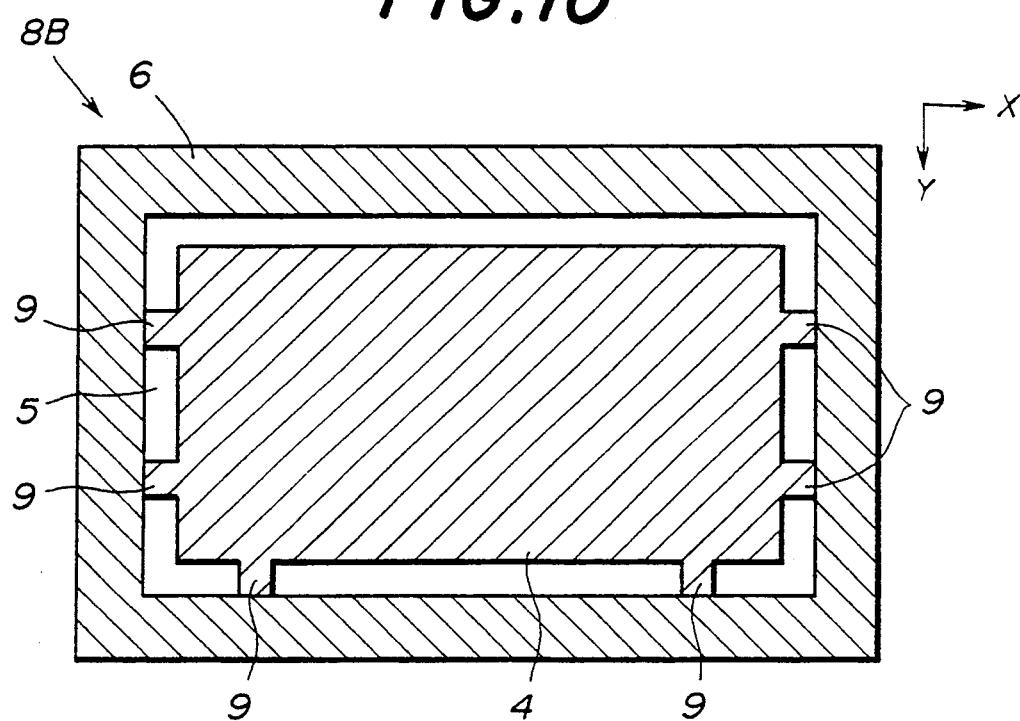
FIG. 10 is a plan view of a reticle according to the second preferred embodiment of the present invention.

FIG. 10 shows a reticle corresponding to the reticle 13a shown in FIG. 9(a). A reticle 8B in FIG. 10 does not have any interconnection line pattern which extends upward.

Figure 11:
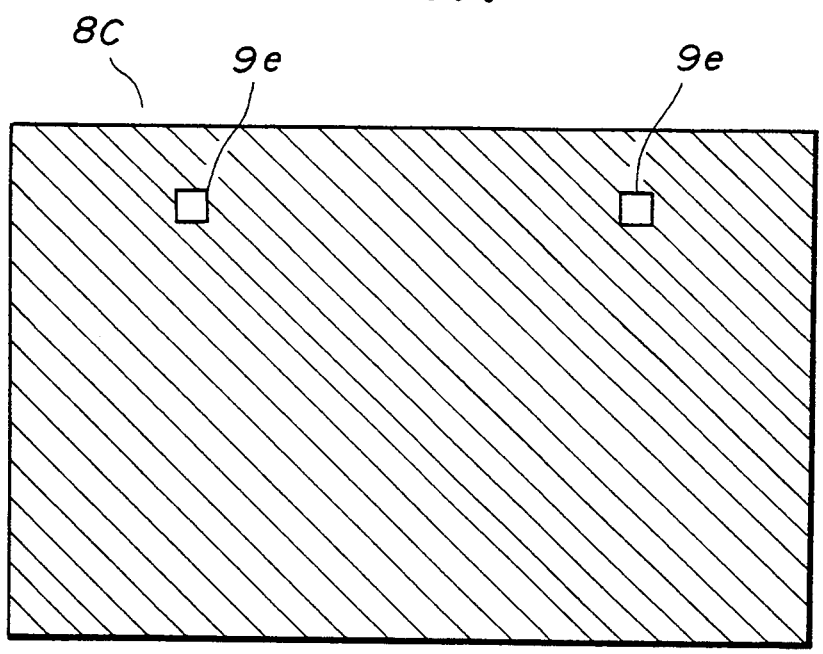
FIG. 11 is a plan view of a reticle according to the second preferred embodiment of the present invention.

It is also possible to form the interconnection lines extending from the chips 12a through 12h by a different procedure. First, internal connection lines formed in each of the chips 12a through 12i and interconnection lines extending therefrom are formed by an identical reticle, such as the reticle 8A shown in FIG. 4. Then different reticles are used which have windows located at positions where unnecessary interconnection lines are formed by the above-mentioned identical reticle. An example of these different reticles is illustrated in FIG. 11. A reticle 8C is used after each chip is formed by the reticle 8A shown in FIG. 4. The reticle 8C has two windows 9e located at positions where interconnection lines extending upward are formed by the reticle 8A shown in FIG. 4. The light is projected onto these unnecessary interconnection lines through the windows 9e of the reticle 8C. In this manner, the unnecessary interconnection lines are eliminated.

Figure 12:
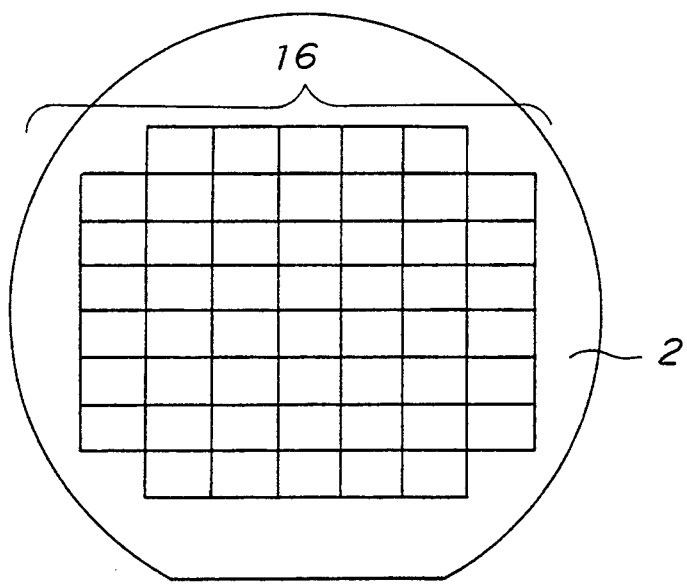
FIG. 12 is a plan view of a wafer-scale semiconductor device according to a third preferred embodiment of the present invention.

A description will now be given of a third embodiment of the present invention. FIG. 12 is a plan view of a wafer-scale semiconductor integrated circuit device according to the third embodiment of the present invention. The device shown in FIG. 12 has chips 16 formed on the wafer 2. Each of the chips 16 is formed by a reticle identical with the reticle 8A shown in FIG. 4.

Figure 13:
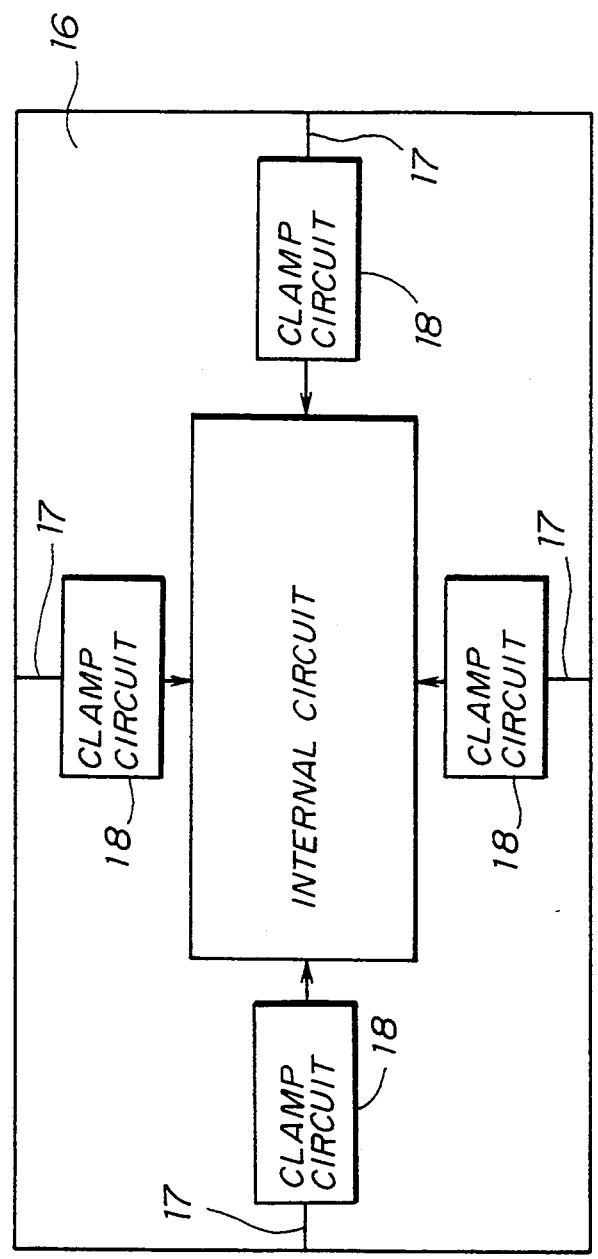
FIG. 13 is a diagram illustrating an essential arrangement of the device according to the third preferred embodiment of the present invention.

Each of the chips 16 shown in FIG. 12 is illustrated in FIG. 13. The illustrated chip 16 has input lines 17 which extend in the four different directions and clamp circuits 18 having inputs connected to the input lines 17. The input lines 17 are parts of the interconnection lines, such as the interconnection lines 31 shown in FIG. 16, or connected thereto. Each of the clamp circuits 18 has an output, which is connected to an internal connection line (not shown) formed in the chip 16. That is, input signals carried on the input lines 17 are supplied to an internal logic circuit of the chip 16 through the clamp circuits 18. Each of the clamp circuits 18 functions to prevent the corresponding input line 17 from being in the floating state. The connection lines in the clamp circuit 18 are formed by the internal connection line pattern area 4 of the reticle.

Four different configurations of each clamp circuit 18 are individually shown in FIGS. 14A through 14D. The clamp circuit 18 shown in FIG. 14A includes an N-channel MOS transistor Tr1, which is connected between the input line 17 and ground G (which serves as a negative power source Vss). The gate of the MOS transistor Tr1 is supplied with a positive power source voltage Vcc. Thus, the MOS transistor Tr1 is always maintained in an ON state where the MOS transistor Tr1 provides a high impedance. In a state where no input signal is applied to the input line 17, the MOS transistor Tr1 is ON so that the input line 17 is maintained at a low level (approximately equal to the ground potential Vss). When a high-level input signal is applied to the input line 17, the input line 17 is maintained at a high level (approximately equal to Vcc) since the MOS transistor Tr1 is in the ON state where it functions as a high impedance element.

It will be noted that all the chips 16 shown in FIG. 12 are provided with the clamp circuits 18. Thus, the interconnection lines 10a shown in FIG. 6 which are not connected to other interconnection lines are always maintained at the low level by the clamp circuits 18 connected thereto. Thus, it becomes possible to prevent the interconnection lines 10a from being in the floating state. On the other hand, "active" interconnection lines to which the high-level signal and/or low-level input signal is applied transfer the input signals to the internal logic circuit through the clamp circuit 18. Since the MOS transistor 18 is maintained in the high-impedance state, power consumption in the MOS transistor 18 is extremely low.

Figure 14A:
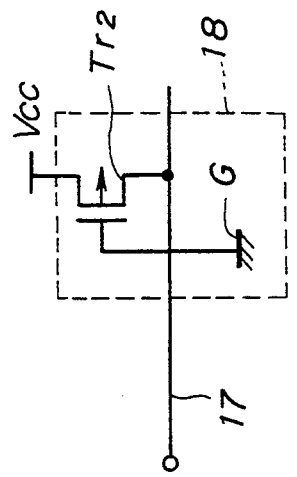
Figure 14B:
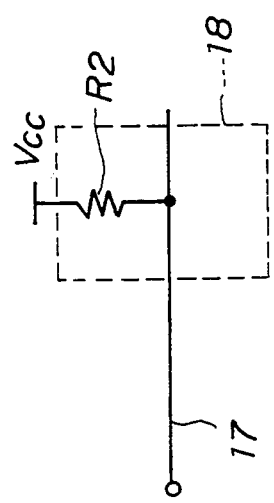

The clamp circuit 18 shown in FIG. 14B includes a P-channel MOS transistor Tr2 coupled to the Vcc power source and the interconnection line 17. The gate of the MOS transistor Tr2 is grounded. Thus, the MOS transistor Tr2 is in the ON state where it provides a high impedance. The clamp circuit 18 shown in FIG. 14B maintains the interconnection line 17 at the high level except that the low-level input signal is applied to the interconnection line 17. Thus, it is possible to prevent the interconnection line 17 from being in the floating state.

Figure 14C:
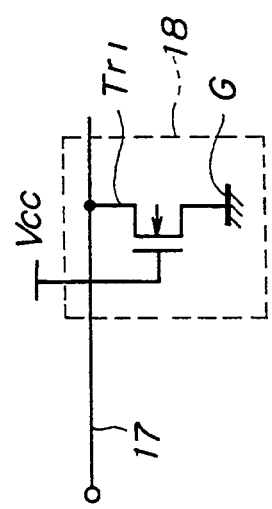
Figure 14D:
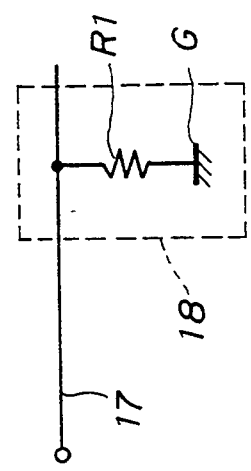

The clamp circuit 18 shown in FIG. 14C includes a resistor R1 which has a high resistance and is connected between the interconnection line 17 and the ground. The clamp circuit 18 shown in FIG. 14D includes a resistor R2 which has a high resistance and is connected between the Vcc power source and the interconnection line 17.

Figure 15:
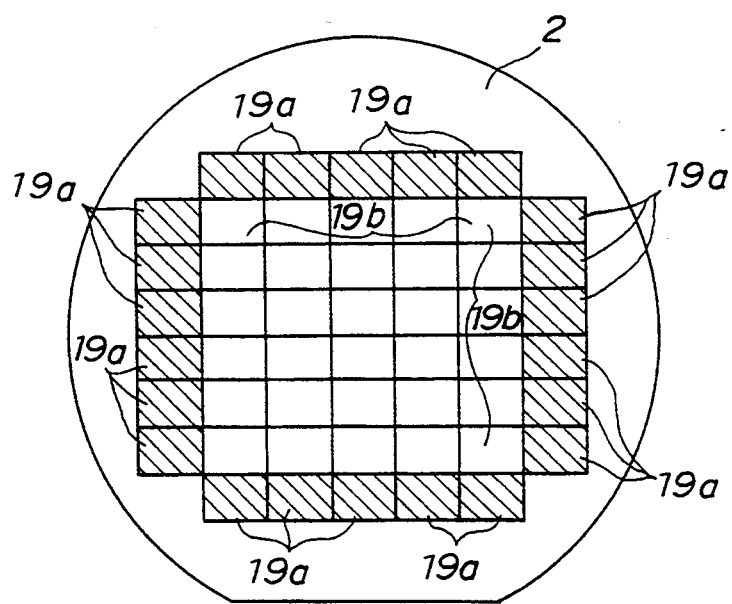
FIG. 15 is a plan view of an alternative arrangement of the third embodiment of the present invention.

Alternatively, as shown in FIG. 15, it is possible to provide only chips 19a arranged at the periphery of the chip arrangement with the clamp circuits 18. That is, chips 19b positioned inside the chips 19a at the periphery do not have any clamp circuits 18. It will be noted that the embodiment shown in FIG. 12 is superior to the embodiment in FIG. 15 from the manufacturing procedure point of view.

Figure 16:
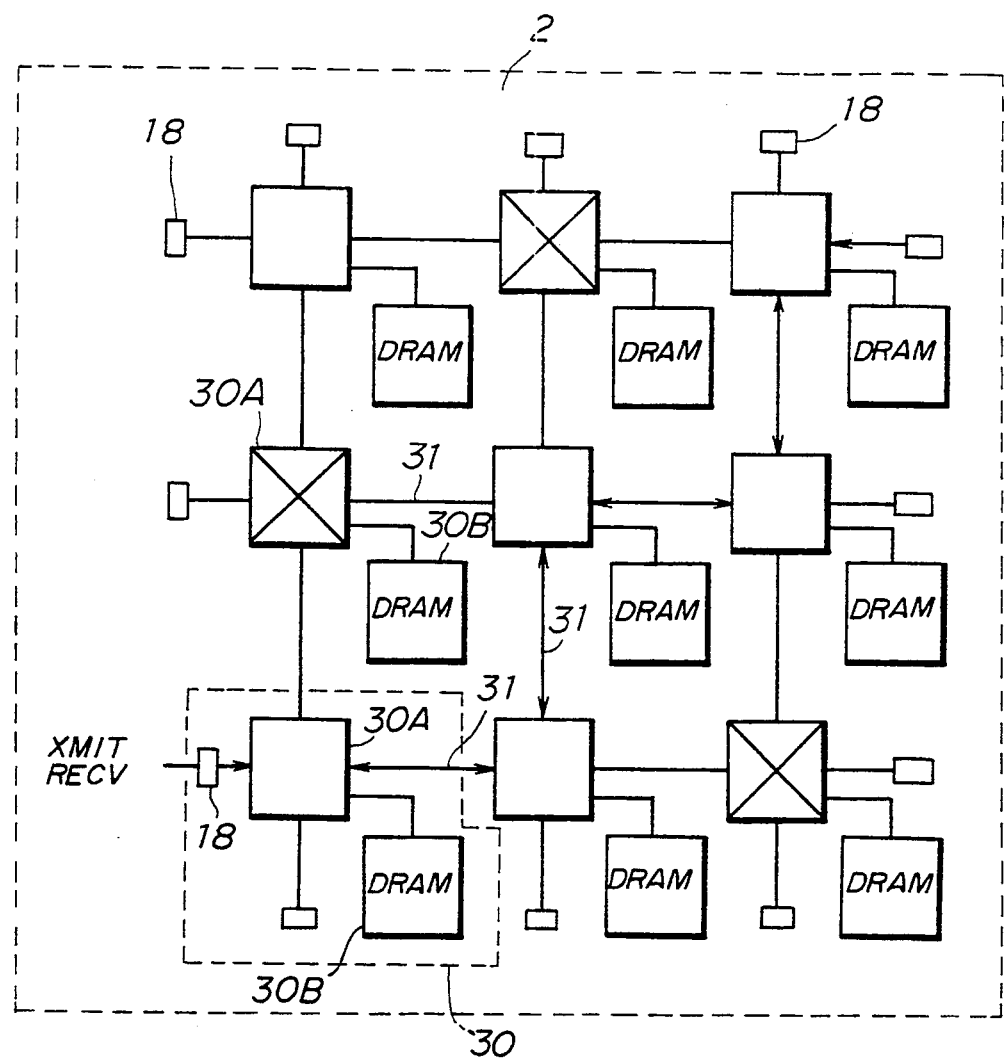
FIG. 16 is a block diagram of an electrical structure of the wafer-scale semiconductor device according to the present invention.

FIG. 16 illustrates an electrical configuration of each chip on the wafer 2. Each chip 30 in FIG. 16 is made up of a controller 30A and a DRAM (dynamic random access memory) 30B. The aforementioned logic circuit corresponds to the combination of the controller 30A and the DRAM 30B. The adjacent chips 30 are connected by bidirectional interconnection lines 31. Each controller 30A block having a cross mark has the DRAM 30B which includes a defect. As will be described later, a signal path is established so that the controllers 30A related to DRAMS 30B having no defect are sequentially connected.

Figure 17:
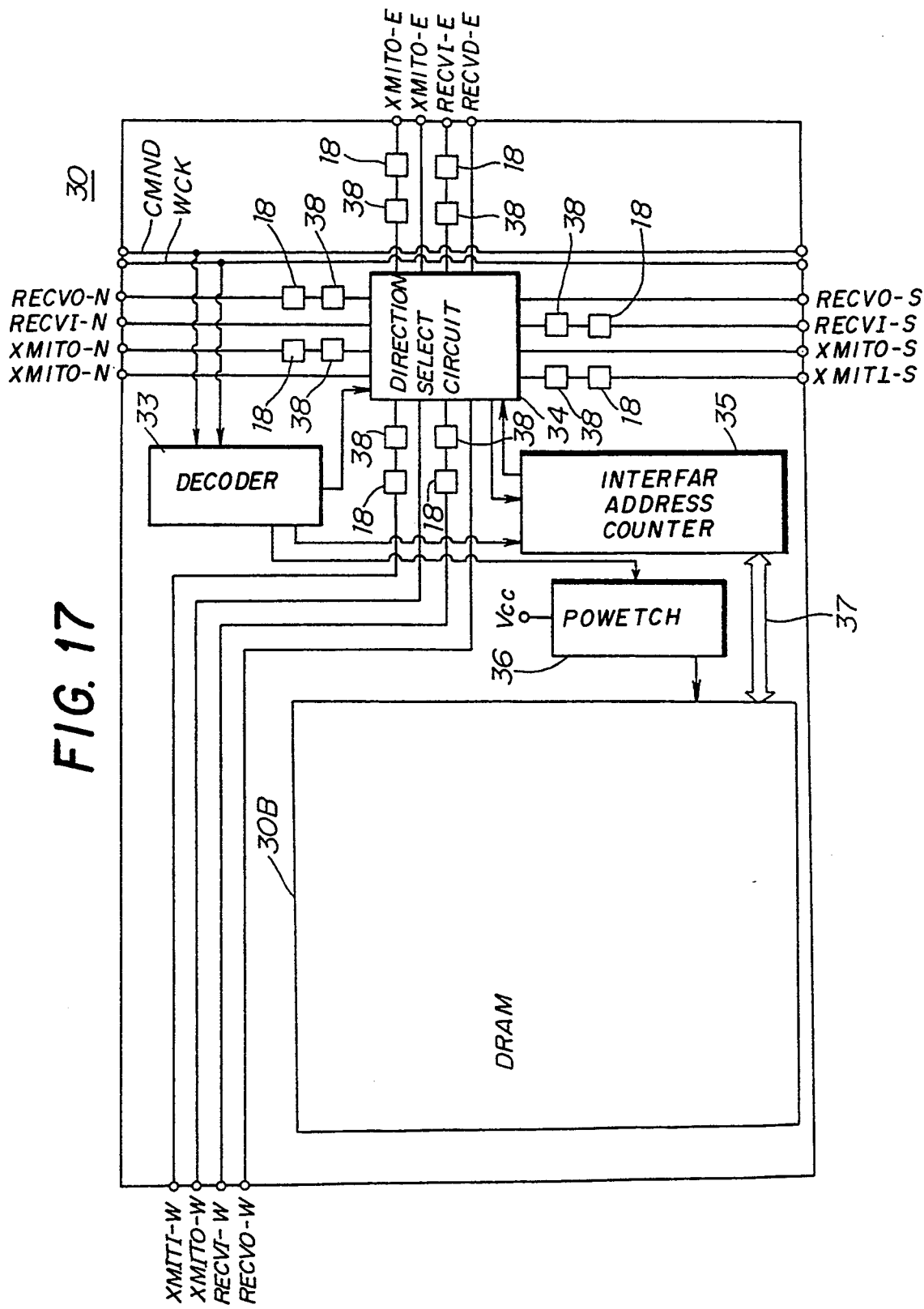
FIG. 17 is a block diagram of a detailed structure of each chip formed on a wafer of the device shown in FIG. 16.

FIG. 17 is a block diagram illustrating a detailed structure of each chip 30 shown in FIG. 16. The controller 30A is made up of a decoder 33, a direction select circuit 34, an interface/address counter 35, a power switch 36, a bus 37, a plurality of clamp circuits 18 and input buffers 38. Input lines XMITI-W, -S, -E and -N and input lines RECVi-W, -S, -E and -N are coupled to the direction select circuit 34 through the clamp circuits 18 and input buffers 38, as shown in FIG. 17, When input data supplied from the chip located on the left side of the chip 30 in FIG. 17 is written into the DRAM 30B shown in FIG. 17, either one of the input lines XMITI-W or RECVI-W is selectively used. On the other hand, when the chip 30 functions as a "terminal" which only passes the received input data to an adjacent chip, the other input line is used. Output lines XMITO-W, -S, -E and -N and input lines RECVO-W, -S, -E and -N extend from the direction select circuit 34. The decoder 33 receives a command signal CMND and a write clock signal WCK supplied from an external device (not shown) and controls the direction select circuit 34, the interface/address counter 35 and the power switch 36. The interface/address counter 35 derives all signals necessary for the operation of the DRAM 30B from the signal supplied from the decoder 33. Examples of the above-mentioned signals are a row address strobe signal, a column address strobe signal, a write enable signal, an output enable signal and an address signal so that a read/write operation and refresh operation are realized. The power switch 36 supplies the DRAM 30B with power, which is turned ON/OFF under the control of the decoder 33.

Figure 19:
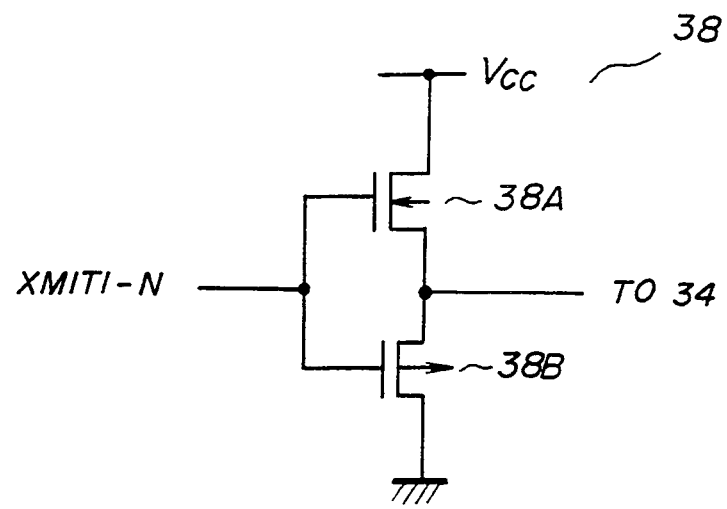
FIG. 19 is a circuit diagram of an inverter used in the direction select circuit shown in FIG. 18.
Figure 18:
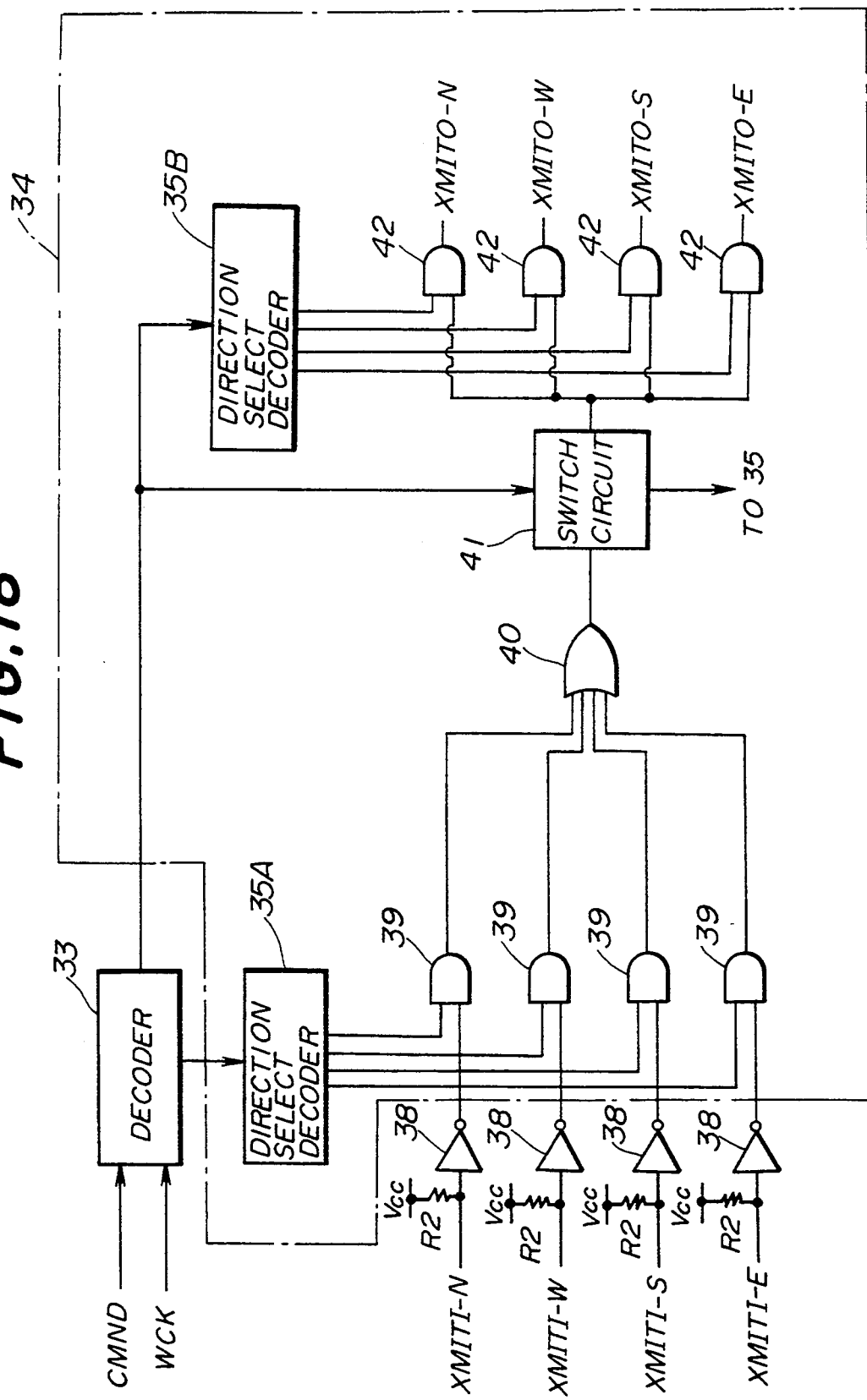
FIG. 18 is a circuit diagram of a detailed structure of a direction select circuit shown in FIG. 17.

FIG. 18 is a block diagram of the direction select circuit 34 shown in FIG. 17. The direction select circuit 34 is made up of two direction select decoders 35A and 35B, input buffers 36, four AND gates 38, an OR gate 40, a switch circuit 41 and four AND gates 42. As shown in FIG. 19, each of the input buffers 38 is formed of a CMOS inverter composed of a P-channel MOS transistor 38A and an N-channel MOS transistor 38B. The command signal CMND is input to the decoder 33 in synchronism with the write clock WCK. The decoder 33 outputs decoded signals which are to be supplied to the direction select decoders 35A and 35B and the switch circuit 41. The input signals XMITI-N, -W, -S and -E are supplied to the input buffers 38. The clamp circuits 18 of the resistors R2 are connected to the inputs of the input buffers 38. The outputs of the input buffers 38 are connected to the AND gates 39, which are supplied with control signals produced and output by the direction select decoder 35A. The direction select decoder 35A sets one of the control signals to the high level in accordance with the command signal CMND. The outputs of the AND gates 39 are connected to the OR gate 40, the output of which is input to the switch circuit 41. The switch circuit 41 supplies the signal from the OR gate 40 to either the interface/address counter 35 or a group of AND gates 42 in accordance with the command signal CMND. The output signal from the switch circuit 41 is supplied to the AND gates 42, which are controlled by the direction select decoder 35B. The direction select decoder 35B activates one of the AND gates 42 in accordance with the command signal CMND. The signal from the switch circuit 41 passes through the activated AND gate 42 and is output as a corresponding one of the output signals XMITO-N, -W, -S and -E. The same configuration is provided for the input lines RECVI-N, -W, -S and -E.

Figure 20:
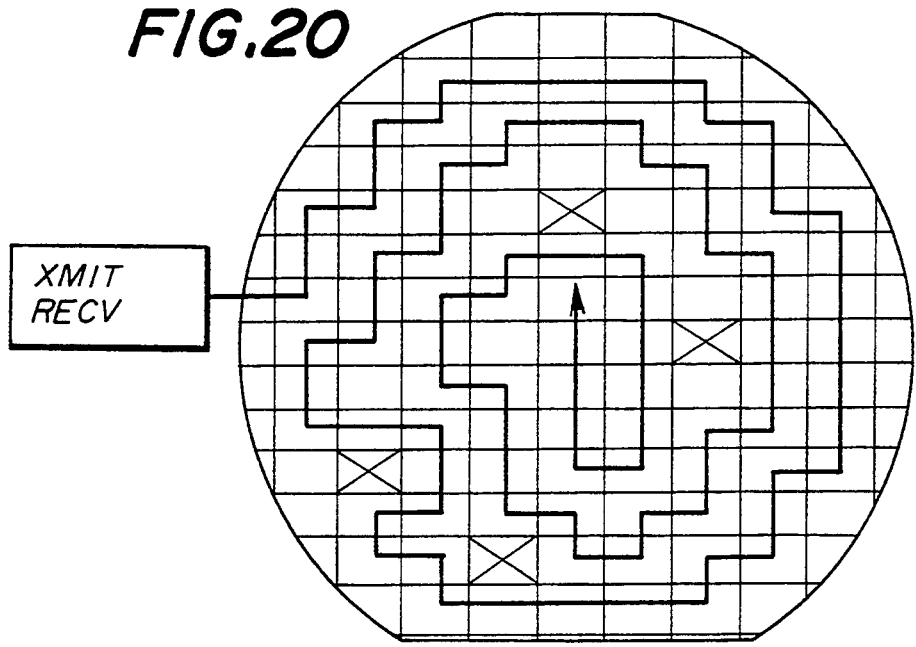
FIGS. 20 and 21 are diagrams illustrating how the chips are mutually connected due to the function of the direction select circuit provided in each of the chips of the device shown in FIG. 16.

The direction select circuit 34 provided in each chip and shown in FIG. 17 provided in each chip selects the input lines, as shown in FIG. 20. It will be noted that in FIG. 20, any block having a cross mark denotes a chip having a defect. In FIG. 20, when one of the adjacent chips to which data is to be transferred is selected, the adjacent chips are accessed in the clockwise direction and it is sequentially determined whether or not the chip being considered has a defect. Information on whether or not the adjacent chips have defects is supplied from an EPROM (not shown), which is mounted on the same board as the present wafer-scale device.

Figure 21:
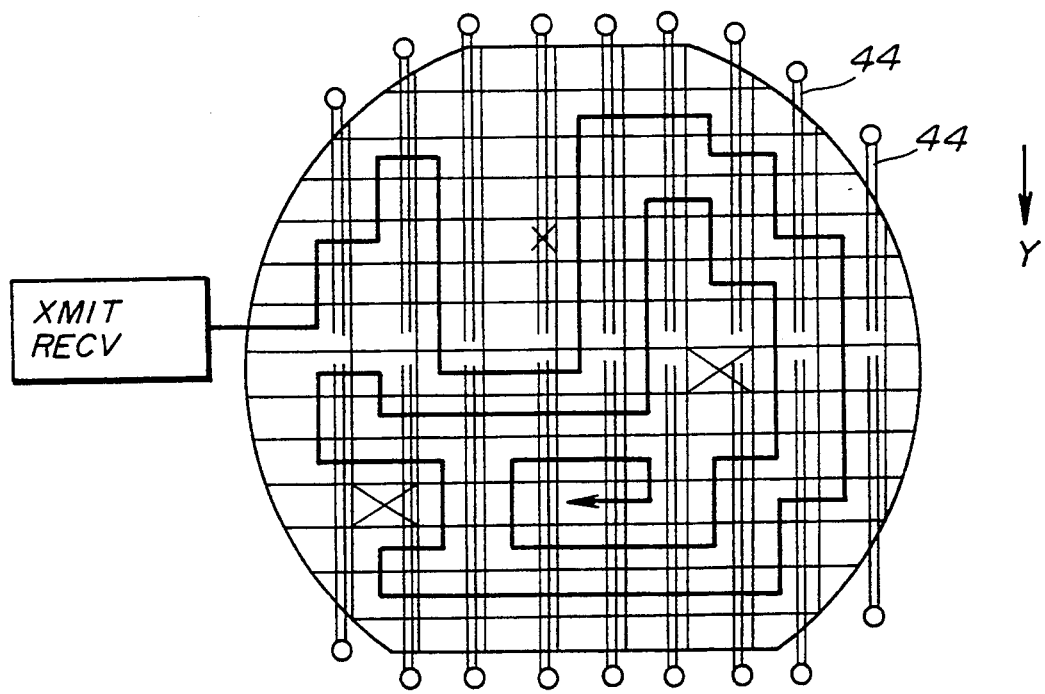

Alternatively, the direction select circuit 34 provided in each chip and shown in FIG. 17 selects the input lines, as shown in FIG. 21. In the configuration shown in FIG. 21, common lines 44 extend in the Y direction for each of the upper and lower half portions of the wafer. The common lines 44 carry the power source voltages Vcc and Vss (ground), the command signal CMND and the write clock WCK. The interconnection shown in FIG. 21 is established so that it avoids any defective chips and disconnection of the common line 44 as indicated by a cross mark. It is also possible to provide dummy chips at the periphery of the chip arrangement in place of the aforementioned clamp circuits 18. The dummy chips function as the clamp circuits 18. That is, the dummy chips set the unnecessary interconnection lines to the high/or low level so that the unnecessary interconnection lines are prevented from being in the floating state.

The present invention is not limited to the specifically described embodiments, and variations and modifications may be made without departing from the scope of the present invention.

What is claimed is:

1. A wafer-scale semiconductor integrated circuit device comprising:
   a wafer;
   a plurality of function blocks formed on said wafer, each of said function blocks having an internal logic circuit;
   interconnection lines mutually connecting said function blocks; and
   means, provided for said function blocks which are located at a periphery of an arrangement of said function blocks, for preventing said interconnection lines related to said function blocks located at the periphery from being in a floating state, said means including a predetermined pattern of said interconnection lines whereby said interconnection lines extend to adjacent function blocks, said predetermined pattern being dependent on the location of each corresponding function block at said periphery and dependent on said function blocks adjacent thereto.

2. A wafer-scale semiconductor integrated circuit device as claimed in claim 1, wherein:
   each of said function blacks located at the periphery has inputs to which corresponding lines from among said interconnection lines are coupled; and
   said means comprises clamp means, provided fox each of said corresponding lines from among said interconnection lines, for maintaining each of said corresponding lines of the interconnection lines at a predetermined signal level when each of said corresponding lines from among said interconnection lines is not connected to other function blocks.

3. A wafer-scale semiconductor integrated circuit device as claimed in claim 2, wherein:
   said clamp means comprises a MOS transistor connected between each of said corresponding lines from among said interconnection lines and a predetermined power source; and
   a gate of said MOS transistor is set to a potential different from that of said predetermined power source.

4. A wafer-scale semiconductor integrated circuit device as claimed in claim 3, wherein the gate of said MOS transistor is set to a potential which is higher than that of said predetermined power source.

5. A wafer-scale semiconductor integrated circuit device as claimed in claim 3, wherein the gate of said MOS transistor is set to a potential less than that of said predetermined power source.

6. A wafer-scale semiconductor integrated circuit device as claimed in claim 2, wherein:
   said clamp means comprises a resistor connected between each of said corresponding lines of the interconnection lines and a predetermined power source.

7. A wafer-scale semiconductor integrated circuit device as claimed in claim 1, wherein:
   each of remaining function blocks of said function block other than said function blocks from among said function blocks which are located at the periphery of the arrangement comprises means, provided for said remaining function block which are located inside said periphery, for preventing said interconnection lines related to said remaining function blocks located inside said periphery from being in a floating state.

8. A wafer-scale semiconductor integrated circuit device as claimed in claim 7, wherein:
   each of said remaining function blocks located inside said periphery has inputs to which corresponding lines of said interconnection lines are coupled; and
   said means related to said remaining function blocks comprises clamp means, provided for each of said corresponding lines from among said interconnection lines coupled to said remaining function blocks, for maintaining each of said corresponding lines from among said interconnection lines at a predetermined signal level when each of said corresponding lines from among said interconnection lines is not connected to other chips.

9. A wafer-scale semiconductor integrated circuit device as claimed in claim 1, wherein:
   each of said function blocks located at said periphery comprises input buffer means, coupled to said means, for buffering an input signal which is carried on a corresponding one of said interconnection lines and which is supplied from said means and for outputting a buffered input signal to said internal logic circuit.

10. A wafer-scale semiconductor integrated circuit device as claimed in claim 1, wherein said internal logic circuit comprises a dynamic random access memory.

11. A wafer-scale semiconductor integrated circuit device as claimed in claim 1, wherein said internal logic circuit comprises select means, provided for each of said function block, for selecting one of the adjacent chips of said function blocks though a corresponding one of said interconnection lines.

12. A wafer-scale semiconductor integrated circuit as claimed in claim 1, wherein:
   each of said function blocks comprises four ends;
   said interconnection lines include input interconnection lines which are arranged on said four ends of each of said function blocks;
   each of said function blocks comprises a CMOS input buffer to which a corresponding one of the input interconnection lines is connected; and
   an input signal is supplied to a corresponding one of said function blocks through said corresponding one of the input interconnection lines and said CMOS input buffer.

13. A wafer-scale semiconductor integrated circuit device as claimed in claim 12, wherein each of said function blocks comprises a first direction select circuit which selects one of said input interconnection lines arranged on said four ends, and wherein an input signal is supplied to a corresponding one of the function blocks through a selected one of the input interconnection lines.

14. A wafer-scale semiconductor integrated circuit device as claimed in claim 12, wherein:
said interconnection lines include output interconnection lines arranged on said four ends of each of the function blocks;
each of said function blocks comprises a second direction select circuit which selects one of said output interconnection lines; and an output signal from each of said function blocks is supplied to a selected one of the output interconnection lines.

15. A wafer-scale semiconductor integrated circuit device as claimed in claim 14, wherein each of said function blocks comprises a switch circuit which selectively connects said selected one of the input interconnection lines to either one of said selected one of the output interconnection lines or said internal logic circuit.

16. A wafer-scale semiconductor integrated circuit device as claimed in claim 15, wherein:
each of said function blocks comprises a decoder which is connected to said first and second direction select circuits and said switch circuit and which derives control signals from a command; and
said control signals controlling said first and second direction select circuits and said switch circuit.

* * * * *